(12) United States Patent
Richmond et al.

(10) Patent No.: US 11,662,371 B2
(45) Date of Patent: May 30, 2023

(54) SEMICONDUCTOR DEVICES FOR IMPROVED MEASUREMENTS AND RELATED METHODS

(71) Applicant: Wolfspeed, Inc., Durham, NC (US)

(72) Inventors: James Richmond, Hillsborough, NC (US); Edward Robert Van Brunt, Raleigh, NC (US)

(73) Assignee: Wolfspeed, Inc., Durham, NC (US)

( * ) Notice: Subject to any disclaimer, the term of this patent is extended or adjusted under 35 U.S.C. 154(b) by 227 days.

(21) Appl. No.: 17/115,359

(22) Filed: Dec. 8, 2020

(65) Prior Publication Data

US 2022/0178979 A1   Jun. 9, 2022

(51) Int. Cl.
*G01R 27/02* (2006.01)
*H01L 29/16* (2006.01)
*H01L 29/78* (2006.01)

(52) U.S. Cl.
CPC .......... *G01R 27/02* (2013.01); *H01L 29/1608* (2013.01); *H01L 29/7811* (2013.01)

(58) Field of Classification Search
CPC ..... G01R 27/02; G01R 27/08; H01L 29/1608; H01L 29/7811; H01L 2924/10272; H01L 29/0619; H01L 2924/10155; H01L 2924/13055; H01L 2924/13091; H01L 22/32; H01L 29/0696; H01L 29/4238; H01L 29/7395; H01L 29/7809; H01L 29/7815; H01L 22/14; G01N 27/025
USPC ......................................................... 324/713
See application file for complete search history.

(56) References Cited

U.S. PATENT DOCUMENTS

| 5,828,308 | A | 10/1998 | Fukami | |
|---|---|---|---|---|
| 6,342,709 | B1 | 1/2002 | Sugawara et al. | |
| 2010/0207234 | A1* | 8/2010 | Tanaka | H01L 24/03 |
| | | | | 257/E29.007 |
| 2014/0367770 | A1 | 12/2014 | Aoki et al. | |
| 2017/0352600 | A1 | 12/2017 | Yamanaka et al. | |
| 2018/0114843 | A1 | 4/2018 | Saitoh et al. | |
| 2018/0269313 | A1* | 9/2018 | Bina | H01L 29/423 |

(Continued)

OTHER PUBLICATIONS

International Search Report and Written Opinion for International Patent Application No. PCT/US2021/062121, dated Apr. 5, 2022, 18 pages.

*Primary Examiner* — Tung X Nguyen
*Assistant Examiner* — Robert P Alejnikov, Jr.
(74) *Attorney, Agent, or Firm* — Myers Bigel, P.A.

(57) ABSTRACT

Semiconductor devices, and in particular semiconductor devices for improved resistance measurements and related methods are disclosed. Contact structures for semiconductor devices are disclosed that provide access to resistance measurements with reduced influence of testing-related resistances, thereby improving testing accuracy, particularly for semiconductor devices with low on-resistance ratings. A semiconductor device may include an active region and an inactive region that is arranged along a perimeter of the active region. The semiconductor device may be arranged with a topside contact to provide access for resistance measurements, for example Kelvin-sensing resistance measurements. Related methods include performing resistance measurements from a topside of the semiconductor device, even when the active region of the semiconductor device forms a vertical contact structure.

27 Claims, 8 Drawing Sheets

(56) References Cited

U.S. PATENT DOCUMENTS

| | | |
|---|---|---|
| 2018/0308973 A1 | 10/2018 | Ebiike et al. |
| 2019/0019887 A1* | 1/2019 | Willmeroth .............. H01H 9/54 |
| 2020/0266268 A1* | 8/2020 | Uchida ............... H01L 29/1608 |

* cited by examiner

SEMICONDUCTOR DEVICES FOR IMPROVED MEASUREMENTS AND RELATED METHODS

FIELD OF THE DISCLOSURE

The present disclosure is related to semiconductor devices, and in particular to semiconductor devices for improved measurements and related methods.

BACKGROUND

Semiconductor devices such as transistors and diodes are ubiquitous in modern electronic devices. Wide bandgap semiconductor material systems such as gallium nitride (GaN) and silicon carbide (SiC) are being increasingly utilized in semiconductor devices to push the boundaries of device performance in areas such as switching speed, power handling capability, and thermal conductivity. Examples include individual devices such as metal-oxide-semiconductor field-effect transistors (MOSFETs), metal-insulator-semiconductor field-effect transistors (MISFETs), insulated gate bipolar transistors (IGBTs), Schottky barrier diodes, PiN diodes, high electron mobility transistors (HEMTs), and integrated circuits such as monolithic microwave integrated circuits (MMICs) that include one or more individual devices.

Semiconductor devices for power switching applications typically include a device region of a semiconductor die that in some cases can be surrounded by an edge termination region. The device region forms an active portion or region, while the edge termination region forms an inactive portion of the power semiconductor device that may serve to decrease concentrations of electric fields along device edges for prevention of breakdown in the blocking mode. The active region of some semiconductor devices can include large numbers of unit cells that are be electrically coupled in parallel with one another between one or more electrodes for providing selective current conducting and voltage blocking capabilities for the device.

Semiconductor devices for power switching applications are continuously being developed with improved operating characteristics in order to meet and enable the evolving demands of modern electronics. As operating characteristics are being continuously improved, challenges can exist when using conventional characterization techniques to accurately quantify modern semiconductor devices.

The art continues to seek improved semiconductor devices and characterization techniques that are capable of overcoming challenges associated with conventional semiconductor devices.

SUMMARY

The present disclosure is related to semiconductor devices, and in particular to semiconductor devices for improved measurements and related methods. Contact structures for semiconductor devices are disclosed that provide access to resistance measurements with reduced influence of testing-related resistances, thereby improving testing accuracy, particularly for semiconductor devices with low on-resistance ratings. A semiconductor device may include an active region and an inactive region that is arranged along a perimeter of the active region. The semiconductor device may be arranged with a topside contact to provide access for resistance measurements, for example Kelvin-sensing resistance measurements. Related methods are disclosed that involve performing resistance measurements from a topside of the semiconductor device, even when the active region of the semiconductor device forms a vertical contact structure.

In one aspect, a semiconductor device comprises: a drift region comprising an active region and an inactive region, wherein the inactive region is arranged along a perimeter of the active region; a first contact on a first side of the drift region; and a second contact on a second side of the drift region that is opposite the first side of the drift region, wherein the second contact is arranged along the inactive region. The second contact may form a Kelvin-sense contact on the second side of the drift region. The semiconductor device may further comprise a passivation layer on the second side of the drift region, wherein the second contact is accessible through an opening formed in the passivation layer. In certain embodiments, the inactive region comprises an edge termination region that is between the active region and a peripheral edge of the drift region, and the second contact is arranged on a portion of the drift region that is between the edge termination region and the peripheral edge of the drift region. In certain embodiments, the drift region comprises a surface depletion protection region that has a same doping type as a doping type of the drift region and a higher doping concentration than a doping concentration of the drift region; the edge termination region is arranged between the active region and the surface depletion protection region; and the second contact is on the surface depletion protection region. In certain embodiments, the drift region comprises silicon carbide (SiC). In certain embodiments, the active region comprises a SiC metal-oxide-semiconductor field-effect-transistor (MOSFET). In certain embodiments, the first contact is a first drain contact on the first side of the drift region and the second contact is a second drain contact on the second side of the drift region. The second contact may be arranged on a first surface of the drift region and a sidewall of the drift region. The semiconductor device may further comprise a substrate, wherein the first contact is arranged on a first side of the substrate and the second contact is further arranged on a portion of the substrate that is outside of a peripheral edge of the drift region, or the second contact is further arranged on a portion of the first contact that is outside of a peripheral edge of the substrate. In certain embodiments, the edge termination region forms a ring with curved corners around the active region; and the second contact is provided between one of the curved corners of the edge termination region and a peripheral corner of the semiconductor device. The semiconductor device may further comprise additional second contacts that are arranged between other curved corners of the edge termination region and other peripheral corners of the semiconductor device. In certain embodiments, the peripheral corner of the semiconductor device forms part of a rectangular shape for the semiconductor device. In certain embodiments, the peripheral corner of the semiconductor device forms part of a hexagonal shape for the semiconductor device. In certain embodiments, the semiconductor device further comprises a substrate that is arranged between the drift region and the first contact. In certain embodiments, the semiconductor device comprises a surface depletion region that is arranged in the inactive region.

In another aspect, a method of providing Kelvin-sensing measurements comprises: mounting and electrically connecting a first side of a semiconductor device to a conductive support structure; and measuring a Kelvin-sensed voltage from a second side of the semiconductor device that is opposite the first side. In certain embodiments, measuring the Kelvin-sensed voltage comprises: providing a current to the semiconductor device from a first terminal that is connected to the second side of the semiconductor device and a second terminal that is connected to the conductive support structure; and measuring the Kelvin-sensed voltage at a first sense terminal and a second sense terminal that are both connected to the second side of the semiconductor device. In certain embodiments, the semiconductor device is a MOSFET; the first terminal and the first sense terminal are connected to a source contact of the MOSFET; the second terminal is connected to a first drain contact of the MOSFET; and the second sense terminal is connected to a second drain contact of the MOSFET. In certain embodiments, the MOSFET comprises an active region and an inactive region that is arranged along a perimeter of the active region, and the second drain contact is provided on the inactive region. In certain embodiments, the inactive region comprises an edge termination region and the second drain contact is on a portion of the inactive region that is between the edge termination region and a peripheral edge of the semiconductor device.

In another aspect, a method comprises: providing a semiconductor device, the semiconductor device comprising a drift region with an active region and an inactive region; mounting a first side of the semiconductor device to a support structure; and measuring a characteristic of the semiconductor device with a contact that is arranged on a second side of the semiconductor device that is opposite the first side, wherein the contact is arranged on the inactive region. In certain embodiments, measuring the characteristic of the semiconductor device comprises: providing a current to the semiconductor device from a first terminal that is connected to the active region from the second side of the semiconductor device and a second terminal that is connected to the active region from the first side of the semiconductor device; and measuring a voltage at a first sense terminal that is connected to the active region and a second sense terminal that is connected to the contact. In certain embodiments, the semiconductor device is a metal-oxide-semiconductor field-effect-transistor (MOSFET); the first terminal and the first sense terminal are connected to a source contact of the MOSFET; the second terminal is connected to a first drain contact of the MOSFET; and the contact is a second drain contact of the MOSFET. In certain embodiments, the characteristic is a resistance of the semiconductor device. In certain embodiments, the contact is a Kelvin-sense contact.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
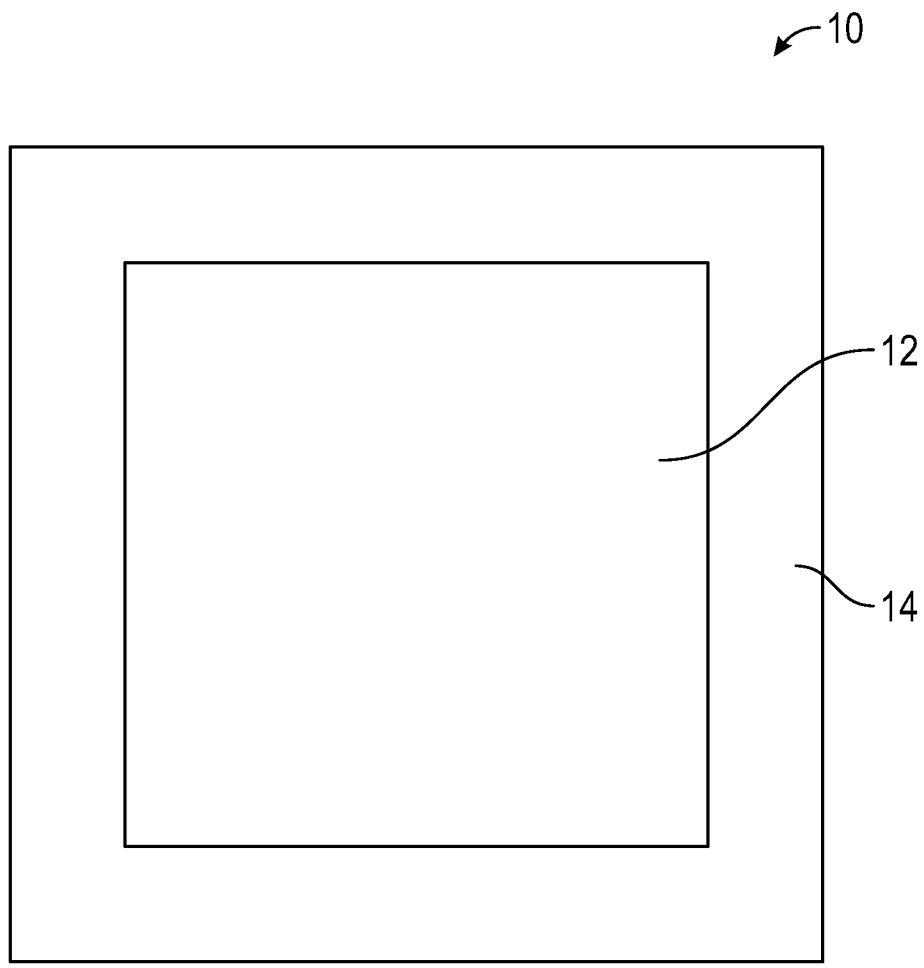
FIG. 1 is a top view illustration of an exemplary semiconductor device according to the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure is related to semiconductor devices, and in particular to semiconductor devices for improved measurements and related methods. Contact structures for semiconductor devices are disclosed that provide access to resistance measurements with reduced influence of testing-related resistances, thereby improving testing accuracy, particularly for semiconductor devices with low on-resistance ratings. A semiconductor device may include an active region and an inactive region that is arranged along a perimeter of the active region. The semiconductor device may be arranged with a topside contact to provide access for resistance measurements, for example Kelvin-sensing resistance measurements. Related methods are disclosed that involve performing resistance measurements from a topside of the semiconductor device, even when the active region of the semiconductor device forms a vertical contact structure.

FIG. 1 is a top view illustration of an exemplary semiconductor device 10 according to the present disclosure. The semiconductor device 10 includes an active region 12 and an edge termination region 14 surrounding the active region 12 about a perimeter of the semiconductor device 10. Depending on the particular application, the active region 12 may include one or more power semiconductor switching devices or cells formed therein, such as one or more metal-oxide-semiconductor field-effect transistors (MOSFETs), metal-insulator-field-effect transistors (MISFETs), and insulated gate bipolar transistors (IGBTs), among others. The semiconductor device 10 may embody wide band gap semiconductor devices, for example silicon carbide (SiC)-based devices, and still further 4H-SiC based devices. The edge termination region 14 reduces a concentration of an electric field at the edges of the semiconductor device 10 in order to improve the performance thereof. For example, the edge termination region 14 may increase a breakdown voltage of the semiconductor device 10, may decrease a leakage current of the semiconductor device 10 over time, and the like as discussed in detail below. By way of example, the edge termination region 14 may include one or more guard rings, a junction termination extension (JTE), and combinations thereof. In certain aspects, the edge termination region 14 may form at least a portion of an inactive region of the semiconductor device 14.

Advances in the design of power semiconductor switching devices have led to devices with lower on-resistance ratings, thereby providing reduced power loss and reduced heat generation in more compact device layouts. By way of example, SiC MOSFETs and SiC MISFETS with low on-resistance ratings are continuously being developed to enable advances in battery-powered electric vehicle technology, among other applications. In the example of SiC MOSFETs, devices with low on-resistance ratings of below 20 milliohm (20 mΩ), or below 15 mΩ, or below 10 mΩ, or in a range from 1 mΩ to 20 mΩ at 25° C., or with even lower on-resistance ratings are being developed. Conventional device characterization techniques may not be suitable for accurately measuring devices with such low on-resistance ratings. For example, during characterization for low on-resistance devices, a device wafer is typically mounted to a conductive chuck for testing, and resistance provided by cables and/or probes leading to the device and the chuck can provide a disproportionate amount of an overall measured resistance. To accommodate this testing voltage drop and provide more accurate on-resistance measurements, Kelvin-sensing techniques are typically used. For Kelvin-sensing, a first set of drive terminals that are connected the source and drain of the MOSFET are used to provide a forward current, and a second set of sensing terminals that are also connected to the source and drain are provided to collect a voltage measurement. In this arrangement, the second set of sensing terminals typically have little or no current flow to minimize testing voltage drop. Even when conventional Kelvin-sensing measurement techniques are employed, not all testing resistances and corresponding voltage drops can be fully mitigated, thereby making accurate characterization of low on-resistance devices challenging.

Figure 2:
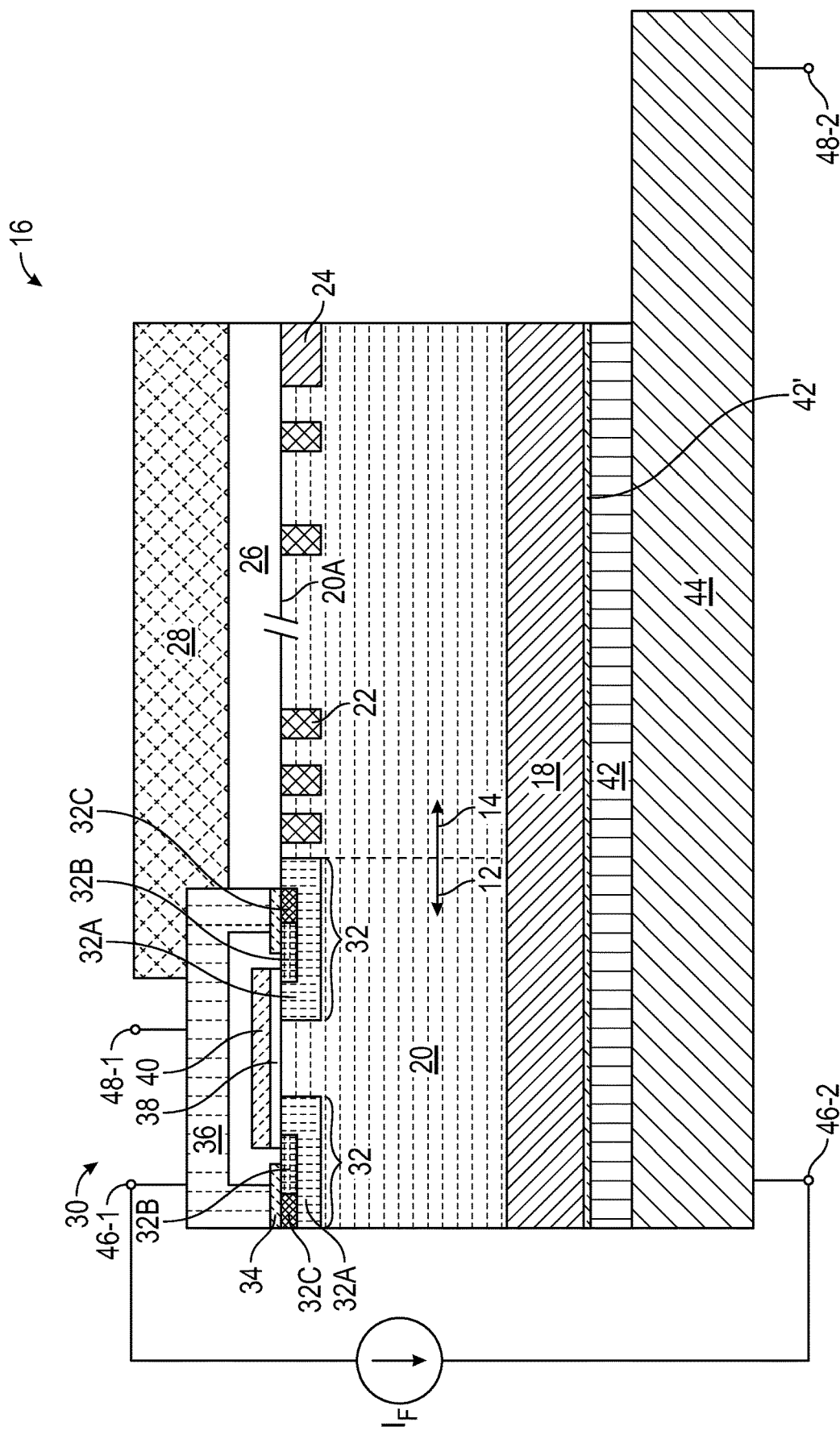
FIG. 2 is a cross-sectional view of an exemplary semiconductor device that is configured for Kelvin-sensing measurements.

FIG. 2 is a cross-sectional view of an exemplary semiconductor device 16 that is configured for Kelvin-sensing measurements. By way of example, the semiconductor device 16 in FIG. 2 is a planar MOSFET with a vertical contact structure; however, the principles of the present disclosure are applicable to other semiconductor switching devices, including trench MOSFETs, MISFETs, and IGBTs, among others. The semiconductor device 16 includes a substrate 18 and a drift region 20 on the substrate 18. The drift region 20 may embody one or more drift layers of a wide bandgap semiconductor material, for example SiC. A vertical dashed line is illustrated in the drift region 20 to delineate the edge termination region 14 from the active region 12. Additionally, portions of the semiconductor device 16 that are outside the active region 12, including the edge termination region 14, may be referred to as an inactive region. In the edge termination region 14, a number of guard rings 22 are provided in the drift region 20. Specifically, the guard rings 22 are provided adjacent or even directly adjacent a top surface 20A of the drift region 20 opposite the substrate 18. The guard rings 22 may be formed by ion implantation and the implants used may include aluminum (Al), boron (B), or any other suitable p-type dopant when the drift region 20 is configured as an n-type layer. Each guard ring 22 forms a sub-region in the edge termination region 14 that has a doping type that is opposite a doping type of the drift region 20. In the present example, the drift region 20 is an n-type layer while the guard rings 22 are p-type sub-regions. However, the principles of the present disclosure apply equally to devices with opposite polarity configurations where the doping types as illustrated in FIG. 2 may be reversed. For illustrative purposes, five guard rings 22 are illustrated, but the number of guard rings 22 may be five or more, or ten or more, or twenty or more, or in a range from five to twenty, or in a range from ten to twenty, depending on the application.

When a voltage is supported by the drift region 20, electric field concentration tends to be higher at an outside edge of the edge termination region 14 than in portions of the edge termination region 14 that are closer to the active region 12. In certain embodiments, a surface depletion protection region 24, or channel stop, may also be provided in the drift region 20 at the outside edge of the edge termination region 14. The surface depletion protection region 24 may have the same doping type as the drift region 20 but with a higher doping concentration than that of the drift region 20. In this manner, the surface depletion protection region 24 may prevent depletion at a region near or at the top surface 20A of the drift region 20 in order to further improve the performance of the semiconductor device 16. In certain embodiments, the surface depletion protection region 24 is provided by implantation. A passivation layer 26 may be provided on the top surface 20A of the drift region 20 opposite the substrate 18 to passivate the top surface 20A of the drift region 20. The passivation layer 26 may embody one or more layers of insulating materials of any suitable material, for example one or more layers of oxide and/or nitride-based dielectric layers. In certain embodiments, the passivation layer 26 may embody a multilayer structure that includes one or more of a field oxide layer, one or more intermetal dielectric layers, and a top insulating layer. In certain embodiments, an additional passivation layer 28 that may comprise a material with chemical, mechanical, and high temperature stability, for example a polyimide that may provide a scratch-resistant coating, may be provided on the passivation layer 26.

The substrate 18 may have a doping concentration between $1\times10^{17}$ cm$^{-3}$ and $1\times10^{20}$ cm$^{-3}$. In various embodiments, the doping concentration of the substrate 18 may be provided at any subrange between $1\times10^{17}$ cm$^{-3}$ and $1\times10^{20}$ cm$^{-3}$. For example, the doping concentration of the substrate 18 may be between $1\times10^{18}$ cm$^{-3}$ and $1\times10^{20}$ cm$^{-3}$, between $1\times10^{19}$ cm$^{-3}$ and $1\times10^{20}$ cm$^{-3}$, between $1\times10^{17}$ cm$^{-3}$ and $1\times10^{19}$ cm$^{-3}$, between $1\times10^{17}$ cm$^{-3}$ and $1\times10^{18}$ cm$^{-3}$, and between $1\times10^{18}$ cm$^{-3}$ and $1\times10^{19}$ cm$^{-3}$.

The drift region 20 may have a doping concentration between $1\times10^{14}$ cm$^{-3}$ and $1\times10^{18}$ cm$^{-3}$. In various embodiments, the doping concentration of the drift region 20 may be provided at any subrange between $1\times10^{14}$ cm$^{-3}$ and $1\times10^{18}$ cm$^{-3}$. For example, the doping concentration of the drift region 20 may be between $1\times10^{15}$ cm$^{-3}$ and $1\times10^{18}$ cm$^{-3}$, between $1\times10^{16}$ cm$^{-3}$ and $1\times10^{18}$ cm$^{-3}$, between $1\times10^{17}$ cm$^{-3}$ and $1\times10^{18}$ cm$^{-3}$, between $1\times10^{14}$ cm$^{-3}$ and $1\times10^{17}$ cm$^{-3}$, between $1\times10^{14}$ cm$^{-3}$ and $1\times10^{16}$ cm$^{-3}$, between $1\times10^{14}$ cm$^{-3}$ and $1\times10^{15}$ cm$^{-3}$, between $1\times10^{15}$ cm$^{-3}$ and $1\times10^{17}$ cm$^{-3}$, between $1\times10^{15}$ cm$^{-3}$ and $1\times10^{16}$ cm$^{-3}$, and between $1\times10^{16}$ cm$^{-3}$ and $1\times10^{17}$ cm$^{-3}$. The surface depletion protection region 24 may have a doping concentration that is higher than the doping concentration of the drift region 20. In various embodiments, the surface depletion protection region 24 may have a doping concentration in a range from two times to $10^5$ times the doping concentration of the drift region 20.

The guard rings 22 may have a doping concentration between $5\times10^{16}$ cm$^{-3}$ and $1\times10^{21}$ cm$^{-3}$. In various embodiments, the doping concentration of the guard rings 22 may be provided at any subrange between $5\times10^{16}$ cm$^{-3}$ and $1\times10^{21}$ cm$^{-3}$. For example, the doping concentration of the guard rings 20 may be between $5\times10^{18}$ cm$^{-3}$ and $1\times10^{21}$ cm$^{-3}$, between $5\times10^{19}$ cm$^{-3}$ and $1\times10^{21}$ cm$^{-3}$, between $5\times10^{20}$ cm$^{-3}$ and $1\times10^{21}$ cm$^{-3}$, between $5\times10^{16}$ cm$^{-3}$ and $1\times10^{20}$ cm$^{-3}$, between $5\times10^{16}$ cm$^{-3}$ and $1\times10^{19}$ cm$^{-3}$, and between $5\times10^{16}$ cm$^{-3}$ and $1\times10^{20}$ cm$^{-3}$.

As discussed above, the active region 12 may include one or more semiconductor devices. In the example of FIG. 2, the active region 12 includes at least one MOSFET cell 30, for example a SiC-based MOSFET where the drift region 20 embodies one or more layers of SiC. The MOSFET cell 30 includes the substrate 18 and the drift region 20. A number of junction implants 32 are provided in the drift region 20, and specifically in the top surface 20A of the drift region 20 opposite the substrate 18. The junction implants 32 include a first well region 32A having a doping type that is opposite that of the drift region 20 and a second well region 32B having a doping type that is the same as that of the drift region 20. An upper portion 32C of the first well region 32A may be provided with a same doping type as the first well region 32A, with a doping concentration that is the same or higher than a doping concentration of the first well region 32A. A junction field-effect transistor (JFET) region may be defined between the junction implants 32. In certain embodiments, the JFET region may have a same doping type as that of the drift region 20, with a doping concentration that is the same or higher than the doping concentration of the drift region 20. A source contact 34 is provided over each one of the junction implants 32 on the top surface 20A of the drift region 20 opposite the substrate 18 such that the source contact 34 contacts a portion of the first well region 32A and a portion of the second well region 32B. A source contact connector 36 may be provided to electrically connect with each source contact 34. A gate oxide layer 38, which may embody other insulating materials for other semiconductor devices, is provided on the top surface 20A of the drift region 20 opposite the substrate 18 and a portion of each one of the junction implants 32 such that the gate oxide layer 38 partially overlaps each one of the second well regions 32B. A gate contact 40 is provided on the gate oxide layer 34. A drain contact 42 is provided on a surface of the substrate 18 opposite the drift region 20. In certain embodiments, the drain contact 42 may include a multiple layer contact structure with a first layer 42' of the drain contact 42 providing improved ohmic contact with the substrate 18. The MOSFET cell 30 may be tiled across the active region 12 or tiled in a desired pattern with one or more other semiconductor devices (e.g., diodes) to provide a desired functionality.

In FIG. 2, the semiconductor device 16 is arranged for resistance measurements, for example Kelvin-sensing measurements. In this regard, the semiconductor device 16 is arranged on a conductive support structure 44, such as chuck. A first terminal 46-1 is electrically connected to the source contact 34 (by way of the source contact connector 36 in FIG. 2), and a second terminal 46-2 is electrically connected to the drain contact 42 by way of the conductive support structure 44. A first sense terminal 48-1 is also connected to the source contact 34 (by way of the source contact connector 36), and a second sense terminal 48-2 is electrically connected to the drain contact 42 by way of the conductive support structure 44. During testing, a signal is provided at the gate contact 40 to turn on the MOSFET cell 30, and a current $I_F$ is provided through the drain contact 42 by way of the first and second terminals 46-1, 46-2. A Kelvin-sensed voltage at the source contact 34 ($V_{S,Kelvin}$) is provided by the first sense terminal 48-1, and a Kelvin-sensed voltage at the drain contact 42 ($V_{D,Kelvin}$) is provided by the second sense terminal 48-2. In this manner, a drain-to-source on-resistance ($R_{DS(on)}$) for the MOSFET cell 30 may be calculated by the equation $R_{DS(on)} = (V_{D,Kelvin} - V_{S,Kelvin})/I_F$. A number of factors may influence accuracy of such $R_{DS(on)}$ measurements. At the source contact 34, debiasing across the source metallization requires careful probe placement in order to get an accurate reading of device resistance. At the drain contact 42, it may be difficult to ensure careful probe placement since the drain contact 42 is contacted by the conductive support structure 44. Additionally, for wafer-level testing, the second sense terminal 48-2 may only be able to make contact near peripheral edges of the conductive support structure 44, which could be far away from a location of the MOSFET cell 30 (e.g., >100 millimeters (mm) in some arrangements). The conductive support structure 44 may also be subject to debiasing effects that can be compounded by the quality of contact to the conductive support structure 44. Such contact quality can vary depending on contamination of the semiconductor device 16 backside or varying vacuum quality provided by the conductive support structure 44 to hold the semiconductor device 16 in place. In this regard, the $V_{D,Kelvin}$ measurements provided by the second sense terminal 48-2 may still have significant offset due to added measurement resistance that is unrelated to the structure of the semiconductor device 16.

Figure 3:
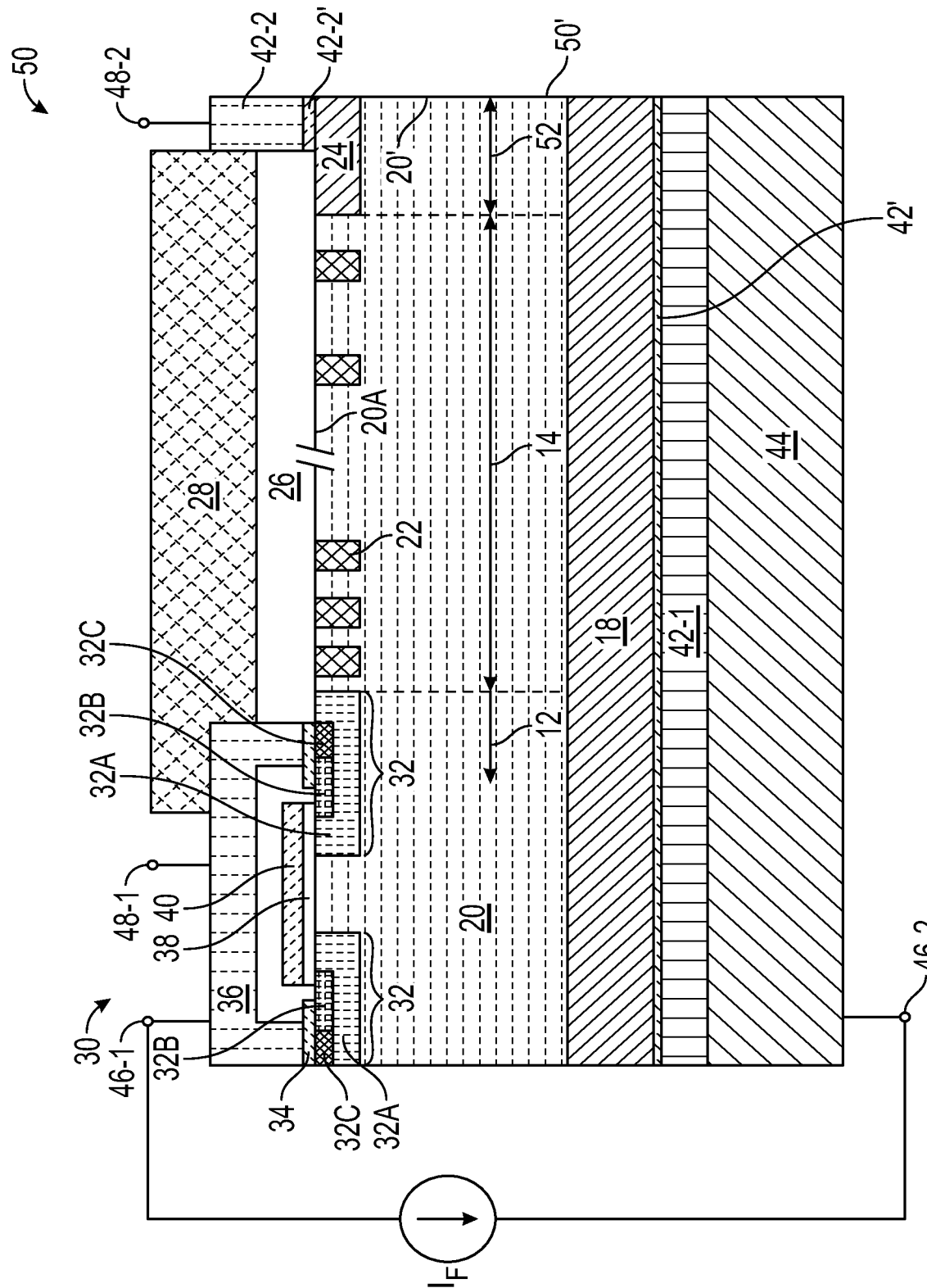
FIG. 3 is a cross-sectional view of a semiconductor device with a vertical contact structure that further includes a second drain contact arranged on a topside of the device for improved Kelvin-sensing measurements.

FIG. 3 is a cross-sectional view of a semiconductor device 50 with a vertical contact structure that further includes a second drain contact 42-2 arranged on a topside of the device for improved resistance measurement, for example Kelvin-sensing measurements. The semiconductor device 50 is similar to the semiconductor device 16 of FIG. 2, and further includes the second drain contact 42-2 on the topside of the semiconductor device 50 that is opposite a bottom side of the semiconductor device 50 where the primary drain contact (or first drain contact 42-1) is located. The bottom side may also be referred to as a first side of the drift region 20 where the first drain contact 42-1 resides and the topside may also be referred to as a second side of the drift region 20 where the second drain contact 42-2 resides. In this arrangement, the drift region 20 is arranged between the first drain contact 42-1 and the second drain contact 42-2, and the second drain contact 42-2 is provided on a same side of the semiconductor device 50 as the source contacts 34 and the gate contact 40. By providing the second drain contact 42-2 on the topside of the semiconductor device 50, Kelvin-sensing measurements may be accomplished where the sensed drain voltage $V_{D,Kelvin}$ is measured at the second drain contact 42-2 without added measurement resistance provided by the conductive support structure 44. In this regard, connections for Kelvin-sensing measurements may be performed from a same side (e.g., topside) of the vertically-structured semiconductor device 50, thereby providing improved accuracy with reduced unnecessary yield loss.

The second drain contact 42-2 may thus form a probe pad that is accessible from the topside of the semiconductor device 50. As illustrated, the second drain contact 42-2 is provided on the edge termination region 14, or stated differently, the second drain contact 42-2 is provided on the inactive region of the semiconductor device 50. The second drain contact 42-2 may also be referred to as a Kelvin-sense contact. As illustrated, portions of the second drain contact 42-2 are uncovered by the passivation layer 26 and the additional passivation layer 28 to provide topside access for the second sense terminal 48-2. In certain embodiments, the second drain contact 42-2 is accessible through an opening formed by one or more of the passivation layer 26 and the additional passivation layer 28. The second drain contact 42-2 may embody a multiple layer contact structure where a first layer 42-2' of the second drain contact 42-2 provides improved ohmic contact with the drift region 20 or with the surface depletion protection region 24 of the drift region 20. In certain embodiments, the surface depletion protection region 24 may define a border of the edge termination region 14, thereby forming a channel stop region 52 between the edge termination region 14 and a peripheral edge 50' of the semiconductor device 50 and a sidewall 20' of the drift region 20. In this regard, the edge termination region 14 and the channel stop region 52 may collectively form an inactive region of the semiconductor device 50.

The sidewall 20' may also be referred to as a peripheral edge of the drift region 20. In this regard, the second drain contact 42-2 may be configured to make an electrical connection with a portion of the drift region 20 that includes the channel stop region 52 and is outside of the edge termination region 14 and the active region 12. For example, the second drain contact 42-2 may be provided between the edge termination region 14 and a peripheral edge of the semiconductor device 50. In such arrangements, the second drain contact 42-2 may be provided without reduction in area of either the edge termination region 14 or the active region 12.

As described above, FIG. 3 illustrates aspects of a method for measuring one or more characteristics, or electrical characteristics, of the semiconductor device 50. In certain embodiments, the characteristic is a resistance measurement or a voltage measurement that may provide Kelvin-sensing measurements for the semiconductor device 50. In particular, the method may include mounting the bottom side of the semiconductor device 50 to the conductive support structure 44 and measuring a Kelvin-sensed voltage from a topside of the semiconductor device 50. During testing, a signal is provided at the gate contact 40 to turn on the MOSFET cell 30 and the current $I_F$ is provided to the first drain contact 42-1. The current $I_F$ is provided by way of the first terminal 46-1 that is connected to the topside of the semiconductor device 50 and the second terminal 46-2 that is connected to the conductive support structure 44. The Kelvin-sensed voltage at the source contact 34 ($V_{S,Kelvin}$) is then measured at the first sense terminal 48-1, and the Kelvin-sensed voltage at the drain contact 42 ($V_{D,Kelvin}$) is measured at the second sense terminal 48-2. In this manner, a drain-to-source on-resistance ($R_{DS(on)}$) for the MOSFET cell 30 may be calculated by the equation $R_{DS(on)} = (V_{D,Kelvin} - V_{S,Kelvin})/I_F$.

Figure 4:
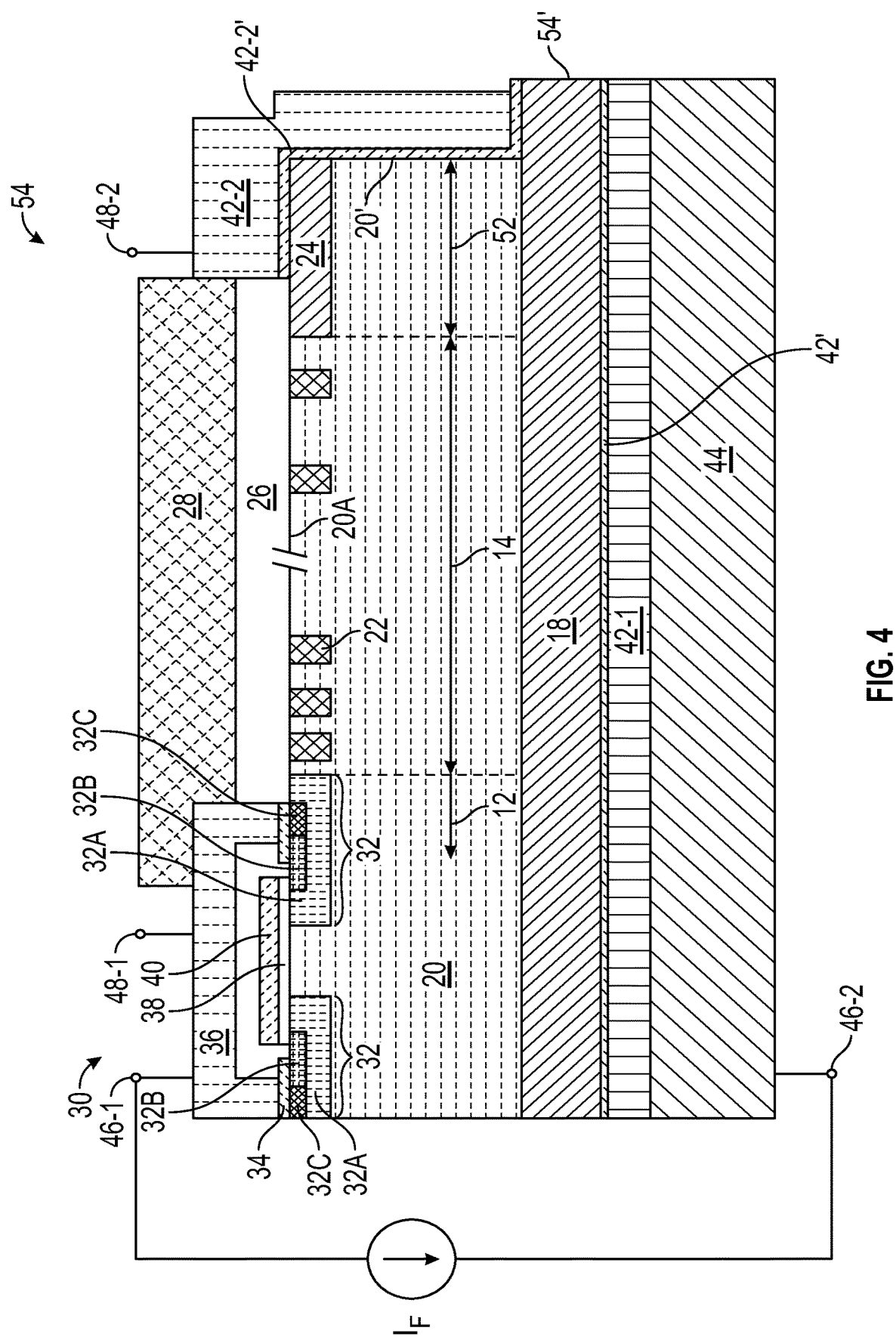
FIG. 4 is a cross-sectional view of a semiconductor device that is similar to the semiconductor device of FIG. 3, and where at least a portion of the second drain contact is arranged outside a channel stop region to provide an electrical connection with a substrate of the semiconductor device.

FIG. 4 is a cross-sectional view of a semiconductor device 54 that is similar to the semiconductor device 50 of FIG. 3, and where at least a portion of the second drain contact 42-2 is arranged outside the channel stop region 52 to provide an electrical connection with the substrate 18. In certain embodiments, portions of the drift region 20 near a peripheral edge 54' of the semiconductor device 54 may be removed by an etching process and portions of the second drain contact 42-2 may be formed in this etched area. The second drain contact 42-2 (and a corresponding first layer 42-2' when present) may then be conformally provided such that portions of the second drain contact 42-2 are provided on the top surface 20A of the drift region, along the sidewall 20' of the drift region 20, and on a top surface of the substrate 18 that is uncovered by the drift region 20, or outside a peripheral edge of the drift region 20. In this manner, the second drain contact 42-2 may be provided with increased contact area. Additionally, the second drain contact 42-2 may provide an electrical connection to the drift region 20 and to the substrate 18 in a position that is closer to the first drain contact 42-1.

Figure 5:
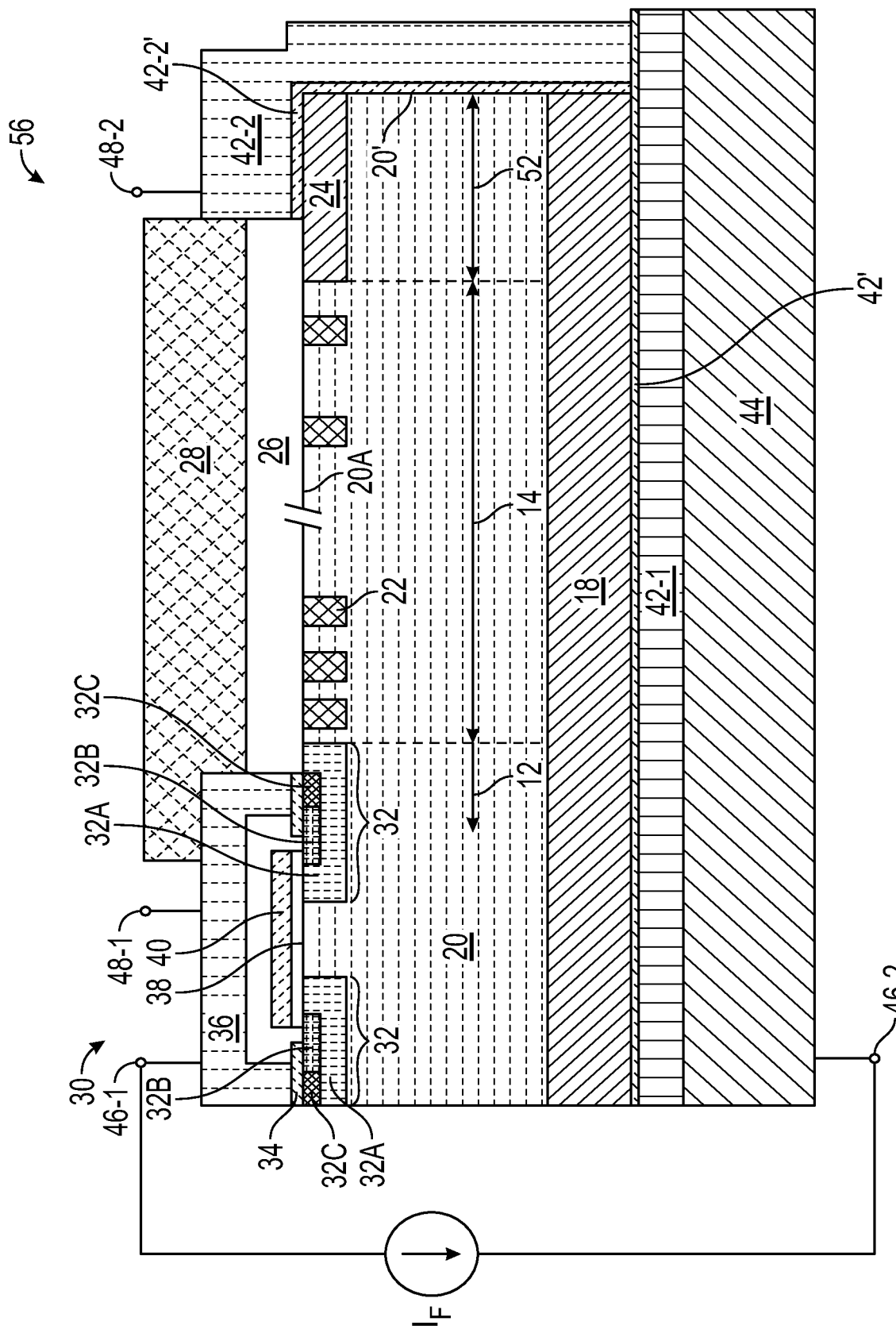
FIG. 5 is a cross-sectional view of a semiconductor device that is similar to the semiconductor device of FIG. 4, and where at least a portion of the second drain contact is arranged to provide an electrical connection the first drain contact through the substrate.

FIG. 5 is a cross-sectional view of a semiconductor device 56 that is similar to the semiconductor device 54 of FIG. 4, and where at least a portion of the second drain contact 42-2 is arranged to provide an electrical connection to the first drain contact 42-1 through the substrate 18. In certain embodiments, portions of the substrate 18 may also be etched to provide access to the first drain contact 42-1. The second drain contact 42-2 (and the corresponding first layer 42-2' when present) may then be conformally provided such that portions of the second drain contact 42-2 are provided on the top surface 20A of the drift region 20, along the sidewall 20' of the drift region 20, and on a top surface of the first drain contact 42-1 that is uncovered by the substrate 18, or outside a peripheral edge of the substrate 18. In this manner, an electrical path from the first drain contact 42-1 to the topside of the semiconductor device 56 is provided that does not include the substrate 18 or the drift region 20.

Figure 6A:
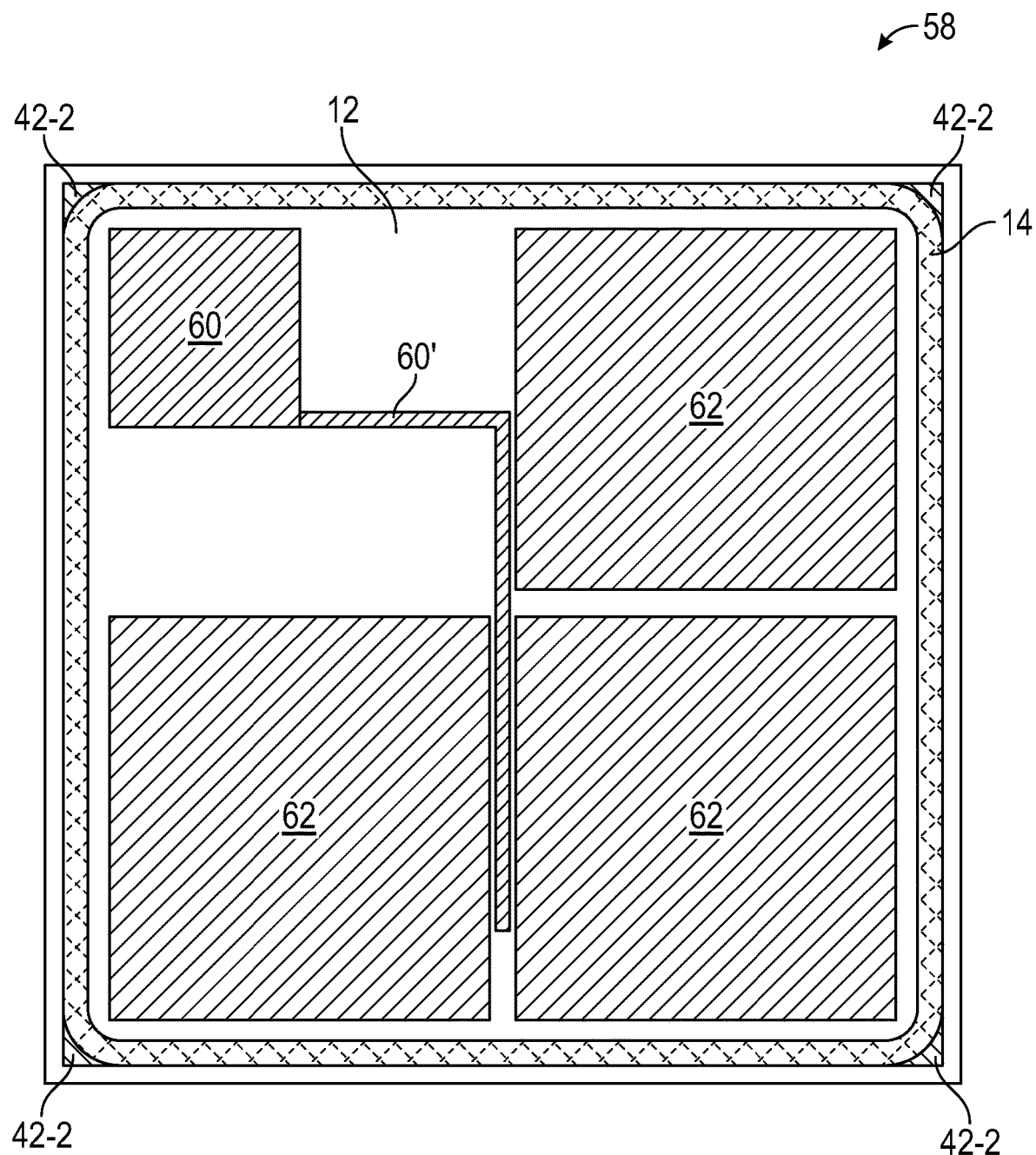
FIG. 6A is a top layout view for a semiconductor device with an improved Kelvin-sensing structure according to principles of the present disclosure.

FIG. 6A is a top layout view for a semiconductor device 58 with an improved Kelvin-sensing structure according to principles of the present disclosure. The semiconductor device 58 may be configured similar to any of the semiconductor devices 50, 54, and 56 respectively of FIGS. 3, 4 and 5. In the top layout view, a gate contact pad 60 and multiple source contact pads 62 are provided in the active region 12. The gate contact pad 60 may include one or more gate contact extensions 60', or buses, that are arranged to provide gate signals from the gate contact 60 to other portions of the active region 12. The gate contact pad 60 is electrically coupled to the gate contact (e.g., 40 as illustrated in FIG. 3). The source contact pads 62 may be provided over other portions of the active region 12, including over certain portions that may include passivation. The source contact pads 62 are electrically coupled to the source contact (e.g., 34 as illustrated in FIG. 3) and/or any source contact connectors (e.g., 36 as illustrated in FIG. 3). In certain arrangements, the source contact pads 62 may embody the source contact connectors 36 of FIG. 3.

Figure 6B:
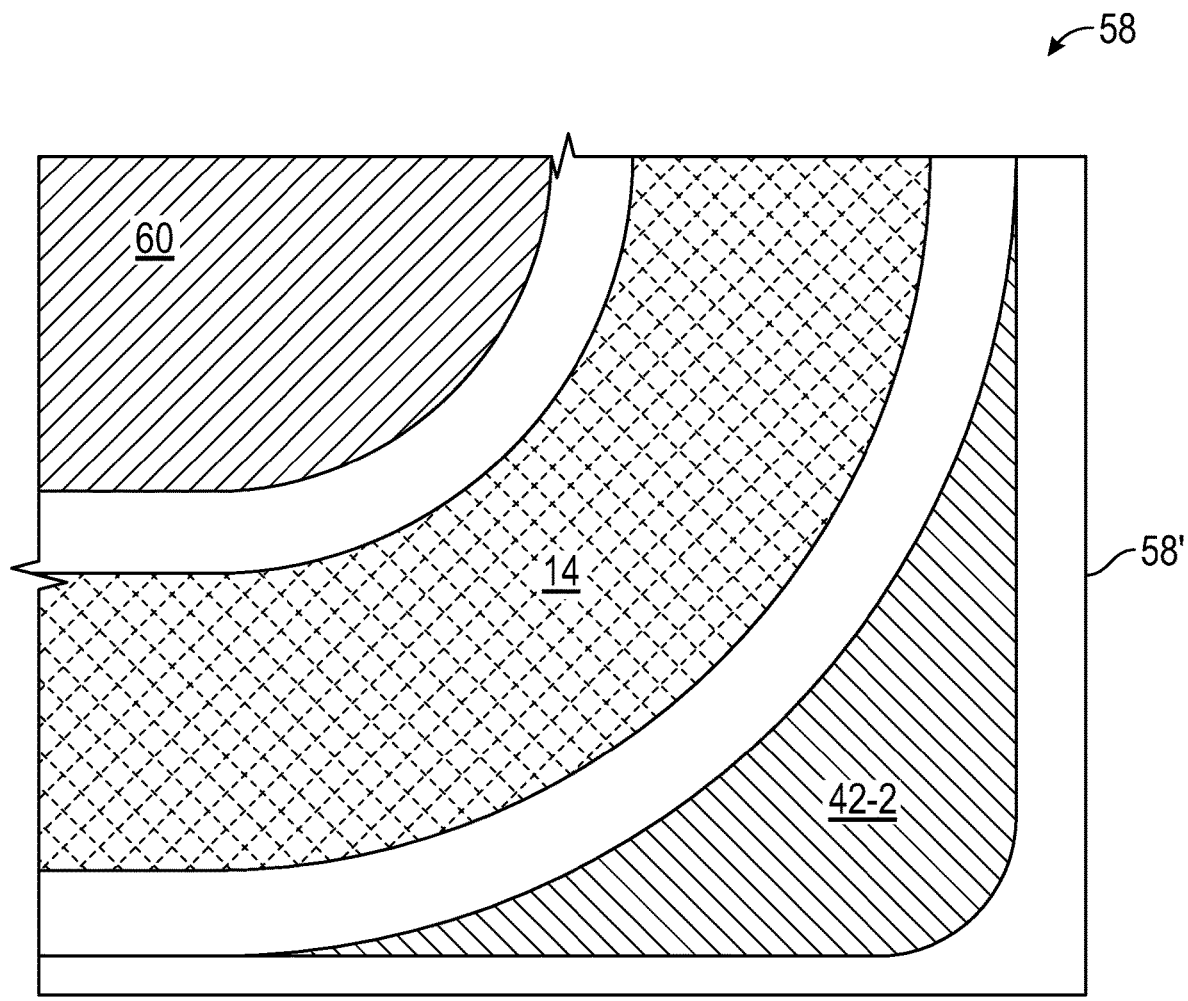
FIG. 6B is a magnified view of a corner of the semiconductor device of FIG. 6A.

As illustrated in FIG. 6A, one or more second drain contacts 42-2 may be provided near corners of the semiconductor device 58 that are outside of the edge termination region 14. The active region 12 may occupy a majority of the overall device area while the edge termination region 14 may form a ring with curved corners around the active region 14. By arranging the second drain contacts 42-2 outside the edge termination region 14, the presence of the second drain contacts 42-2 may not take away area from either the active region 12 or the edge termination region 14. In FIG. 6A, four of the second drain contacts 42-2 are provided at each corner of the square or rectangular-shaped semiconductor device 58 in regions between the curved corners of the edge termination region 14 and peripheral corners of the semiconductor device 58. This may advantageously provide redundancy for the second drain contacts 42-2 in case one or more are damaged with probe tips during Kelvin-sense testing. Additionally, multiple ones of the second drain contacts 42-2 at various locations may provide easier access during Kelvin-sense testing depending on an orientation of the probe tip. In other embodiments, less than all of the device corners, for example no more than three corners, or no more than two corners may include the second drain contacts 42-2. In still further embodiments, improved Kelvin-sense testing may be provided by a single second drain contact 42-2. FIG. 6B is a magnified view of a corner of the semiconductor device 58 of FIG. 6A. As illustrated, the second drain contact 42-2 is arranged in an area that is between the edge termination region 14 and a peripheral edge 58' of the semiconductor device 58. In this manner, the second drain contact 42-2 may be provided with compact size and along inactive portions of the semiconductor device 58. By positioning the second drain contact 42-2 in the device corner, extra surface area may be formed between the curved border of the edge termination region 14 and the square-shaped corner of the semiconductor device 58.

Figure 7:
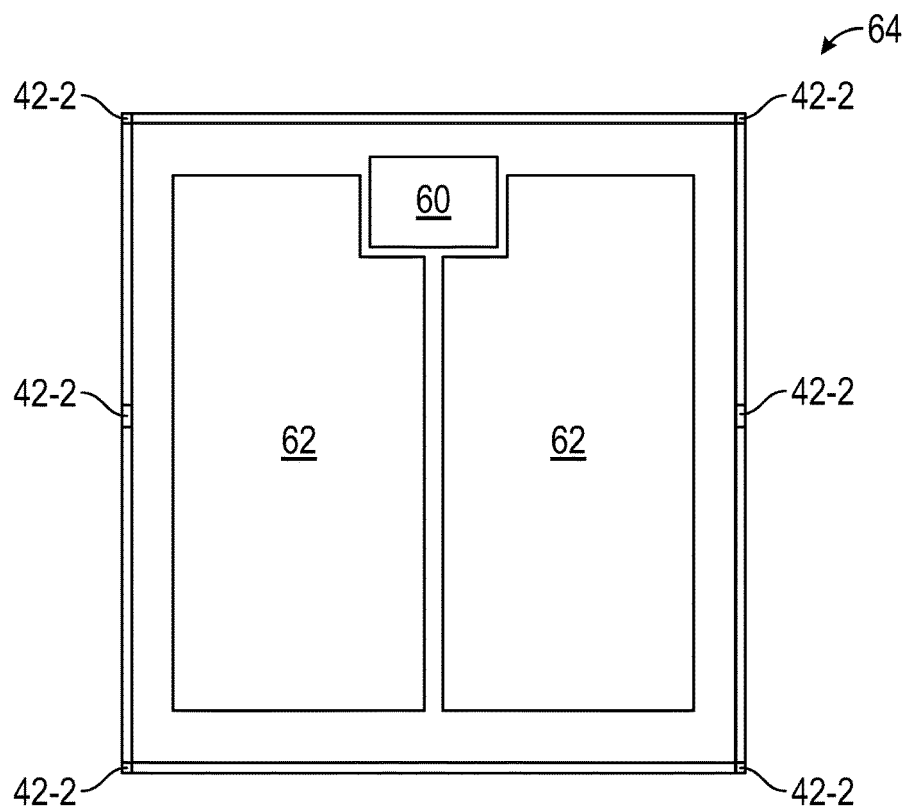
FIG. 7 is a top layout view for another semiconductor device with an improved Kelvin-sensing structure according to principles of the present disclosure.

FIG. 7 is a top layout view for another semiconductor device 64 with an improved Kelvin-sensing structure according to principles of the present disclosure. The semiconductor device 64 is similar to the semiconductor device 58 of FIG. 6B, but includes a different layout for the gate contact pad 60 and the source contact pads 62. As illustrated, four of the second drain contacts 42-2 may be provided in each of the inactive corners of the semiconductor device 64. As previously described, one or more of the second drain contacts 42-2 may be provided in a single corner, two corners, or three corners in other arrangements. In further embodiments, one or more of the second drain contacts 42-2 may be provided along one or more of the peripheral edges of the semiconductor device 64 that are between the corners without deviating from the principles of the present disclosure.

Figure 8:
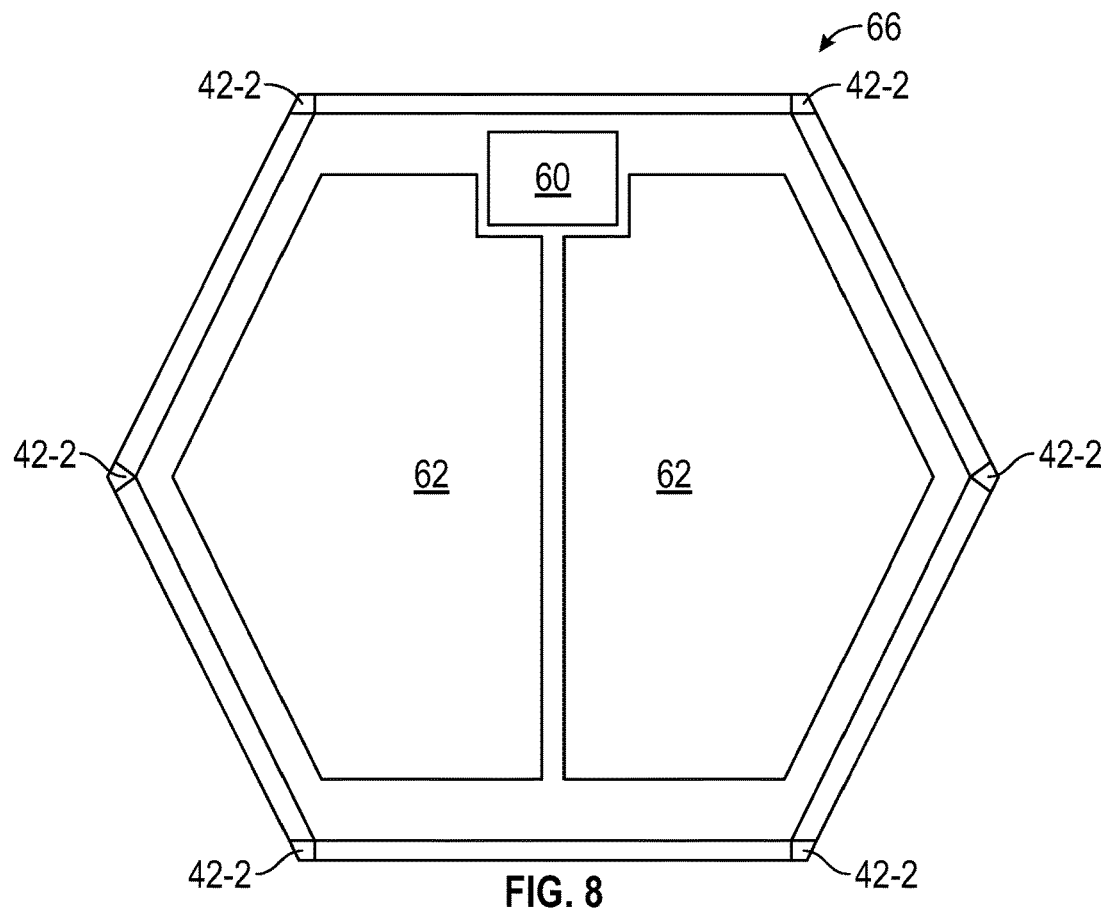
FIG. 8 is a top layout view for a semiconductor device that forms a non-rectangular shape and further includes an improved Kelvin-sensing structure according to principles of the present disclosure.

FIG. 8 is a top layout view for a semiconductor device 66 that forms a non-rectangular shape and further includes an improved Kelvin-sensing structure according to principles of the present disclosure. By way of example, the semiconductor device 66 of FIG. 8 is formed with a hexagonal shape. In this regard, one or more of the second drain contacts 42-2 may be arranged along one or more of the six vertices or corners of the semiconductor device 66. As with other embodiments, less than all of the vertices may include the second drain contact 42-2 while still providing the semiconductor device 66 with improved Kelvin-sensing capabilities.

While embodiments of the present disclosure are provided in the context of an exemplary MOSFET device structure, the principles of the present disclosure are applicable to other device structures, for example trench MOSFETs, MISFETs, and IGBTs, among others. These other device structures may embody wide band gap semiconductor devices, for example SiC-based devices, and still further 4H-SiC based devices. In the case of IGBTs, the source contacts as described above may embody emitter contacts of an IGBT and the first and second drain contacts described above may embody first and second collector contacts of the IGBT. Additionally, while certain embodiments of the present disclosure are provided in the context of wafer level measurements and testing, the principles disclosed are also applicable to measurements and testing of devices in any form factor, including individual devices after singulation from device wafers. For example, individual devices as disclosed herein may be suitably configured for improved resistance measurements, including Kelvin-sensing measurements, for known good die characterization, end-of-line testing, and any other semiconductor die level characterization.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor device comprising:
a drift region comprising an active region and an inactive region, wherein the inactive region is arranged along a perimeter of the active region;
a first contact on a first side of the drift region; and
a second contact on a second side of the drift region that is opposite the first side of the drift region,
wherein the inactive region comprises a channel stop region at a peripheral edge of the drift region, and the second contact is on the channel stop region.

2. The semiconductor device of claim 1, wherein the second contact forms a Kelvin-sense contact on the second side of the drift region.

3. The semiconductor device of claim 1, further comprising a passivation layer on the second side of the drift region, wherein the second contact is accessible through an opening formed in the passivation layer.

4. The semiconductor device of claim 1, wherein the inactive region comprises an edge termination region that is between the active region and the peripheral edge of the drift region, and the edge termination region is separated from the second contact by the channel stop region.

5. The semiconductor device of claim 4, wherein:
the channel stop region comprises a surface depletion protection region that has a same doping type as a doping type of the drift region and a higher doping concentration than a doping concentration of the drift region, and a portion under the surface depletion protection region that has a lower doping concentration than that of the surface depletion protection region;
the edge termination region is arranged between the active region and the surface depletion protection region; and
the second contact is on the surface depletion protection region.

6. The semiconductor device of claim 4, wherein:
the edge termination region forms a ring with curved corners around the active region; and
the second contact is provided between one of the curved corners of the edge termination region and a peripheral corner of the semiconductor device.

7. The semiconductor device of claim 6, further comprising additional second contacts that are arranged between other curved corners of the edge termination region and other peripheral corners of the semiconductor device.

8. The semiconductor device of claim 6, wherein the peripheral corner of the semiconductor device forms part of a rectangular shape for the semiconductor device.

9. The semiconductor device of claim 6, wherein the peripheral corner of the semiconductor device forms part of a hexagonal shape for the semiconductor device.

10. The semiconductor device of claim 1, wherein the drift region comprises silicon carbide (SiC).

11. The semiconductor device of claim 1, wherein the active region comprises a silicon carbide (SiC) metal-oxide-semiconductor field-effect-transistor (MOSFET).

12. The semiconductor device of claim 11, wherein the first contact is a first drain contact on the first side of the drift region and the second contact is a second drain contact on the second side of the drift region.

13. The semiconductor device of claim 1, wherein the second contact is arranged on a first surface of the drift region and a sidewall of the drift region.

14. The semiconductor device of claim 1, further comprising a substrate, wherein the first contact is arranged on a first side of the substrate and the second contact is further arranged on a portion of the substrate that is outside of the peripheral edge of the drift region.

15. The semiconductor device of claim 1, further comprising a substrate, wherein the first contact is arranged on a first side of the substrate and the second contact is further arranged on a portion of the first contact that is outside of a peripheral edge of the substrate.

16. The semiconductor device of claim 1, further comprising a substrate that is arranged between the drift region and the first contact.

17. The semiconductor device of claim 1, further comprising a surface depletion region that is arranged in the inactive region.

18. A method of providing Kelvin-sensing measurements, the method comprising:
mounting and electrically connecting a first side of a semiconductor device to a conductive support structure; and
measuring a Kelvin-sensed voltage from a second side of the semiconductor device that is opposite the first side, wherein a first terminal, a first sense terminal, and a second sense terminal are connected to the second side of the semiconductor device, and a second terminal is connected to the conductive support structure on the first side of the semiconductor device.

19. The method of claim 18, wherein measuring the Kelvin-sensed voltage comprises:
providing a current to the semiconductor device from the first terminal and the second terminal; and
measuring the Kelvin-sensed voltage at the first sense terminal and the second sense terminal.

20. The method of claim 19, wherein:
the semiconductor device is a metal-oxide-semiconductor field-effect-transistor (MOSFET);
the first terminal and the first sense terminal are connected to a source contact of the MOSFET;
the second terminal is connected to a first drain contact of the MOSFET; and
the second sense terminal is connected to a second drain contact of the MOSFET.

21. The method of claim 20, wherein the MOSFET comprises a drift region including an active region and an inactive region that is arranged along a perimeter of the active region, and the second drain contact is provided on the inactive region.

22. The method of claim 21, wherein the inactive region comprises an edge termination region and a channel stop region that is at a peripheral edge of the semiconductor device,
   wherein the channel stop region comprises a surface depletion protection region that has a same doping type as a doping type of the drift region and a higher doping concentration than a doping concentration of the drift region,
   wherein the second drain contact is on the surface depletion protection region between the edge termination region and the peripheral edge of the semiconductor device.

23. A method comprising:
   providing a semiconductor device, the semiconductor device comprising a drift region with an active region and an inactive region;
   mounting a first side of the semiconductor device to a support structure; and
   measuring a characteristic of the semiconductor device with a contact that is arranged on a second side of the semiconductor device that is opposite the first side, wherein the contact is arranged on the inactive region.

24. The method of claim 23, wherein measuring the characteristic of the semiconductor device comprises:
   providing a current to the semiconductor device from a first terminal that is connected to the active region from the second side of the semiconductor device and a second terminal that is connected to the active region from the first side of the semiconductor device; and
   measuring a voltage at a first sense terminal that is connected to the active region and a second sense terminal that is connected to the contact.

25. The method of claim 24, wherein:
   the semiconductor device is a metal-oxide-semiconductor field-effect-transistor (MOSFET);
   the first terminal and the first sense terminal are connected to a source contact of the MOSFET;
   the second terminal is connected to a first drain contact of the MOSFET; and
   the contact is a second drain contact of the MOSFET.

26. The method of claim 23, wherein the characteristic is a resistance of the semiconductor device.

27. The method of claim 23, wherein the contact is a Kelvin-sense contact.

* * * * *